(12) United States Patent
Wang et al.

(10) Patent No.: US 12,237,422 B2
(45) Date of Patent: Feb. 25, 2025

(54) THIN FILM TRANSISTOR, METHOD FOR MANUFACTURING THE SAME, SHIFT REGISTER AND GATE DRIVING CIRCUIT

(71) Applicants: Hefei Xinsheng Optoelectronics Technology Co., Ltd., Anhui (CN); BOE TECHNOLOGY GROUP CO., LTD., Beijing (CN)

(72) Inventors: Qinghe Wang, Beijing (CN); Tongshang Su, Beijing (CN); Jun Wang, Beijing (CN); Yongchao Huang, Beijing (CN); Haitao Wang, Beijing (CN); Ning Liu, Beijing (CN); Jun Cheng, Beijing (CN); Yingbin Hu, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 463 days.

(21) Appl. No.: 17/765,238

(22) PCT Filed: May 20, 2021

(86) PCT No.: PCT/CN2021/094847
§ 371 (c)(1),
(2) Date: Mar. 30, 2022

(87) PCT Pub. No.: WO2021/258933
PCT Pub. Date: Dec. 30, 2021

(65) Prior Publication Data
US 2022/0352382 A1 Nov. 3, 2022

(30) Foreign Application Priority Data

Jun. 24, 2020 (CN) .......................... 202010589567.2

(51) Int. Cl.
H01L 29/786 (2006.01)
G11C 19/28 (2006.01)
H01L 29/66 (2006.01)

(52) U.S. Cl.
CPC ........ *H01L 29/78633* (2013.01); *G11C 19/28* (2013.01); *H01L 29/66742* (2013.01)

(58) Field of Classification Search
CPC ......... H01L 29/78633; H01L 29/66742; H01L 29/78606; H01L 23/552; H01L 29/786;
(Continued)

(56) References Cited

U.S. PATENT DOCUMENTS

2009/0185089 A1 7/2009 Huang
2016/0254338 A1 9/2016 Lin et al.
(Continued)

FOREIGN PATENT DOCUMENTS

| CN | 106486526 A | 3/2017 |
| CN | 110828475 A | 2/2020 |
| CN | 111682075 A | 9/2020 |

OTHER PUBLICATIONS

China Patent Office, Second Office Action, Dec. 1, 2022, application No. CN202010589567.2.
(Continued)

*Primary Examiner* — Mohammad A Rahman
(74) *Attorney, Agent, or Firm* — HOUTTEMAN LAW LLC

(57) ABSTRACT

A thin film transistor, including: at least one active layer pattern including a first conductive pattern, a second conductive pattern, and a semiconductor pattern; a gate on a side of the active layer pattern; a first electrode and a second electrode on a side of the gate away from the active layer pattern, and respectively electrically connected with the first conductive pattern and the second conductive pattern, a
(Continued)

conductive shielding pattern is provided corresponding to the semiconductor pattern in at least one active layer pattern, the conductive shielding pattern is on a side of the semiconductor pattern away from the gate and is electrically connected with the first electrode, and a buffer layer is between the conductive shielding pattern and the semiconductor pattern; an orthographic projection of the conductive shielding pattern on a plane where the semiconductor pattern corresponding thereto is located at least partially covers the semiconductor pattern corresponding.

18 Claims, 12 Drawing Sheets

(58) Field of Classification Search
CPC ..... H01L 21/336; H01L 127/32; G11C 19/28; H10K 59/126
See application file for complete search history.

(56) References Cited

U.S. PATENT DOCUMENTS

2017/0062542 A1* 3/2017 Jung .................... H10K 50/805
2018/0059459 A1* 3/2018 Park .................. G02F 1/136209

OTHER PUBLICATIONS

China Patent Office, First Office Action issued Jul. 1, 2021 for application No. CN202010589567.2.
China Patent Office, Decision of rejection issued Apr. 8, 2022 for application No. CN202010589567.2.

* cited by examiner

THIN FILM TRANSISTOR, METHOD FOR MANUFACTURING THE SAME, SHIFT REGISTER AND GATE DRIVING CIRCUIT

TECHNICAL FIELD

The present application relates to the field of display technology, and in particular to a thin film transistor, a method for manufacturing a thin film transistor, a shift register and a gate driving circuit.

BACKGROUND

In the related art, a Gate Driver on Array (GOA) technology is used to integrate a thin film transistor (TFT) switch circuit on an array substrate to form a scan driver for a display panel, so that a gate driving IC can be omitted.

At present, positive bias temperature stress (PBTS) performance of a part of TFTs in a GOA circuit is relatively poor, and the PBTS performance of the TFT is often improved by improving a film-forming quality of a gate insulator (GI); specifically, a process temperature during a process for manufacturing the gate insulator is increased to obtain a relatively high-quality gate insulator, thereby improving the PBTS performance of the TFT.

However, in practical applications, it is found that a relatively high temperature in the process for manufacturing the gate insulator, on one hand, results in an increased power consumption, and on the other hand, is not suitable for some products (e.g., flexible products) requiring to be manufactured under a relatively low temperature.

SUMMARY

The present disclosure aims to solve at least one of the technical problems in the related art, and provides a thin film transistor, a method for manufacturing the thin film transistor, a shift register and a gate driving circuit.

In a first aspect, an embodiment of the present disclosure provides a thin film transistor, including:
at least one active layer pattern, the active layer pattern includes a first conductive pattern, a second conductive pattern, and a semiconductor pattern located between the first conductive pattern and the second conductive pattern;
a gate located on a side of the active layer pattern and insulated from the active layer pattern;
a first electrode and a second electrode, which are located on a side of the gate away from the active layer pattern, and respectively electrically connected with the first conductive pattern and the second conductive pattern;
a conductive shielding pattern is provided corresponding to the semiconductor pattern in at least one of the at least one active layer pattern, the conductive shielding pattern is located on a side of the semiconductor pattern away from the gate and is electrically connected with the first electrode, and a buffer layer is arranged between the conductive shielding pattern and the semiconductor pattern;
an orthographic projection of the conductive shielding pattern on a plane where the semiconductor pattern corresponding to the conductive shielding pattern is located at least partially covers the semiconductor pattern corresponding to the conductive shielding pattern.

In some implementations, the orthographic projection of the conductive shielding pattern on the plane where the semiconductor pattern corresponding to the conductive shielding pattern is located completely covers the semiconductor pattern corresponding to the conductive shielding pattern.

In some implementations, the orthographic projection of the conductive shielding pattern on the plane where the semiconductor pattern corresponding to the conductive shielding pattern is located further covers at least part of regions of the second conductive pattern to which the semiconductor pattern corresponding to the conductive shielding pattern is connected.

In some implementations, the conductive shielding pattern includes a conductive and light-shielding material.

In some implementations, the conductive and light-shielding material includes a metal material.

In some implementations, the first conductive pattern connected with the semiconductor pattern corresponding to the conductive shielding pattern is connected to the conductive shielding pattern through a via hole in the buffer layer.

In some implementations, the at least one active layer pattern includes a plurality of active layer patterns, and the active layer patterns are arranged in a first preset direction; the gate, the first electrode, and the second electrode each extend along the first preset direction, the first electrode is electrically connected to first conductive patterns of the active layer patterns, and the second electrode is electrically connected to second conductive patterns of the active layer patterns.

In some implementations, the first electrode, the second electrode, and the gate each are a comb-shaped electrode; the first electrode includes a plurality of first comb-tooth portions arranged along a second preset direction and a first connecting portion connected with first ends of the first comb-tooth portions, the second electrode includes a plurality of second comb-tooth portions arranged along the second preset direction and a second connecting portion connected with second ends of the second comb-tooth portions, the gate includes a plurality of third comb-tooth portions arranged along the second preset direction and a third connecting portion connected with second ends of the third comb-tooth portions, the first comb-tooth portions, the second comb-tooth portions and the third comb-tooth portions each extend along a third preset direction;
the first comb-tooth portions and the second comb-tooth portions are alternately arranged in the second preset direction, any pair of the first comb-tooth portion and the second comb-tooth portion, which are adjacent to each other, defines a corresponding active layer pattern arrangement area, one of the third comb-tooth portions and multiple active layer patterns arranged along the second preset direction are provided in each active layer pattern arrangement area, the first conductive patterns in the active layer patterns are connected with the first comb-tooth portion corresponding thereto, and the second conductive patterns in the active layer patterns are connected with the second comb-tooth portion corresponding thereto.

In some implementations, the semiconductor pattern in each active layer pattern is provided the conductive shielding pattern corresponding thereto.

In some implementations, the conductive shielding patterns provided corresponding to the semiconductor patterns of the active layer patterns are connected into one piece.

In a second aspect, an embodiment of the present disclosure further provides a shift register, including: the thin film transistor provided in the first aspect.

In some implementations, the shift register includes a constant voltage supply transistor, a control electrode of the constant voltage supply transistor is electrically connected with a control signal terminal, a first electrode of the constant voltage supply transistor is connected with a constant voltage signal input terminal, and a second electrode of the constant voltage supply transistor is connected with a signal-to-be-supplied terminal, where the constant voltage supply transistor employs the thin film transistor provided in the first aspect.

In a third aspect, an embodiment of the present disclosure further provides a gate driving circuit, including: the shift register provided in the second aspect.

In a fourth aspect, an embodiment of the present disclosure further provides a method for manufacturing the thin film transistor provided in the first aspect, where the method includes:

forming a conductive shielding pattern on a base substrate;

forming a buffer layer on a side of the conductive shielding pattern away from the base substrate, where a via hole communicated to the conductive shielding pattern is formed in the buffer layer;

forming at least one active layer pattern on the buffer layer;

forming a gate insulating layer and a gate on a side of the active layer pattern away from the base substrate, where the gate insulating layer is located between the active layer pattern and the gate;

transforming portions of the active layer pattern not covered by the gate into conductors to obtain a first conductive pattern and a second conductive pattern, where a portion of the active layer pattern between the first conductive pattern and the second conductive pattern is formed as a semiconductor pattern, the semiconductor pattern in at least one of the at least one active layer pattern is provided with the conductive shielding pattern corresponding thereto, and an orthographic projection of the conductive shielding pattern on a plane where the semiconductor pattern corresponding to the conductive shielding pattern is located at least partially covers the semiconductor pattern corresponding to the conductive shielding pattern;

forming an interlayer dielectric layer on a side of the gate away from the active layer pattern, where via holes communicated to the first conductive pattern and the second conductive pattern are formed in the interlayer dielectric layer; and forming a first electrode and a second electrode on a side of the interlayer dielectric layer away from the gate, where the first electrode and the second electrode are respectively connected with the first conductive pattern and the second conductive pattern through the via holes in the interlayer dielectric layer, and the first electrode is electrically connected with the conductive shielding pattern.

DRAWINGS

DETAILED DESCRIPTION

In order to make those skilled in the art better understand the technical solutions of the present disclosure, a thin film transistor, a method for manufacturing a thin film transistor, a shift register, and a gate driving circuit provided by the present disclosure are described in detail below with reference to the accompanying drawings.

Figure 1:
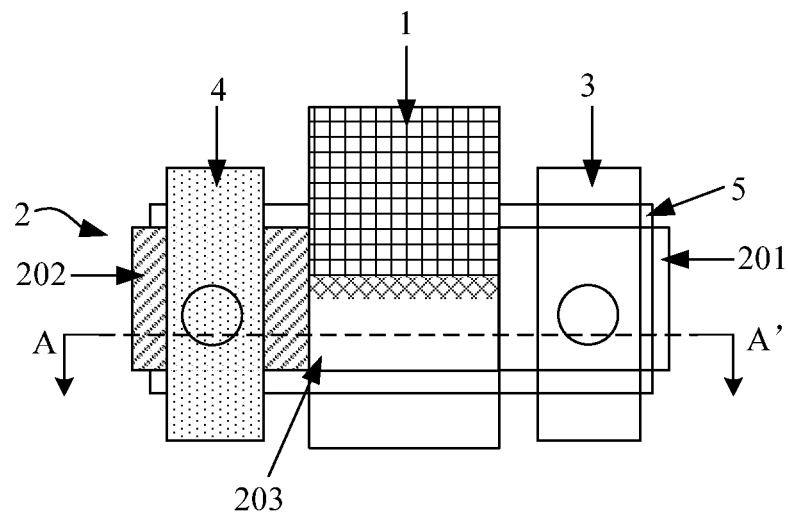
FIG. 1 is a top view of a thin film transistor provided in an embodiment of the present disclosure.
Figure 2:
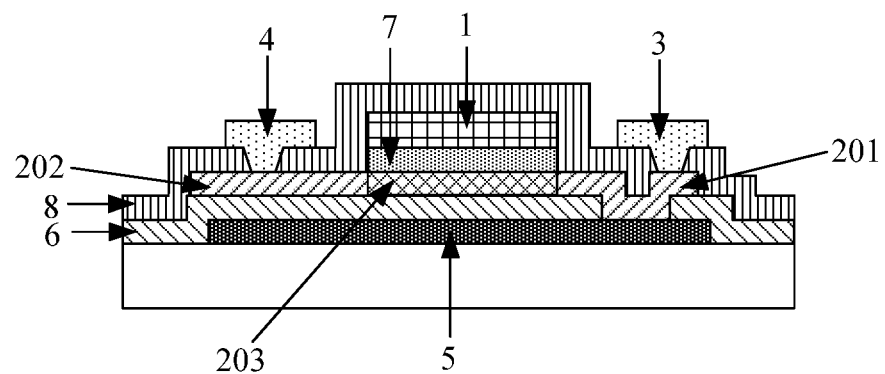
FIG. 2 is a schematic cross-sectional view taken along line A-A' in FIG. 1.

FIG. 1 is a top view of a thin film transistor provided in an embodiment of the present disclosure, and FIG. 2 is a schematic cross-sectional view taken along line A-A' in FIG. 1, as shown in FIG. 1 and FIG. 2, the thin film transistor includes: at least one active layer pattern 2, a gate 1, a first electrode 3, a second electrode 4 and a conductive shielding pattern 5.

In the embodiment of the present disclosure, one of the "first electrode" and the "second electrode" of the thin film transistor is a source, and the other of the "first electrode" and the "second electrode" of the thin film transistor is a drain.

The active layer pattern 2 includes: a first conductive pattern 201, a second conductive pattern 202, and a semiconductor pattern 203 located between the first conductive pattern 201 and the second conductive pattern 202. The gate 1 is located on a side of the active layer pattern 2 and is insulated from the active layer pattern 2, and specifically, a gate insulating layer 7 is arranged between the gate 1 and the active layer pattern 2; the first electrode 3 and the second electrode 4 are located on a side of the gate 1 away from the active layer pattern 2, and the first electrode 3 and the second electrode 4 are electrically connected with the first conductive pattern 201 and the second conductive pattern 202, respectively.

A conductive shielding pattern 5 is provided corresponding to the semiconductor pattern 203 in at least one of the at least one active layer pattern 2, the conductive shielding pattern 5 is located on a side of the semiconductor pattern 203 away from the gate 1, and is electrically connected with the first electrode 3, and a buffer layer 6 is arranged between the conductive shielding pattern 5 and the semiconductor pattern 203; an orthographic projection of the conductive shielding pattern 5 on a plane where the semiconductor pattern 203 corresponding to the conductive shielding pattern is located at least partially covers the semiconductor pattern 203 corresponding to the conductive shielding pattern.

In the embodiment of the present disclosure, the conductive shielding pattern 5 is disposed on the side of the semiconductor pattern 203 away from the gate 1, the conductive shielding pattern 5 is electrically connected to the first electrode 3 of the thin film transistor, and the orthographic projection of the conductive shielding pattern 5 on the plane where the semiconductor pattern 203 corresponding to the conductive shielding pattern is located at least partially covers the semiconductor pattern 203 corresponding to the conductive shielding pattern, in such case, when a constant voltage electrical signal is applied to the first electrode 3 of the thin film transistor, the conductive shielding pattern 5 is also loaded with the constant voltage electrical signal, and the conductive shielding pattern 5 can effectively shield an external electric field from interfering with the semiconductor pattern 203 covered by the conductive shielding pattern 5, so that electrical characteristics of the semiconductor pattern 203 can be improved, and the PBTS performance of the thin film transistor can be correspondingly improved. In such case, the requirement for the film-forming quality of the gate insulating layer 7 in the thin film transistor is decreased, and the process temperature during the process for manufacturing the gate insulating layer 7 can also be correspondingly decreased, i.e., a low-temperature process can be adopted to manufacture the gate insulating layer 7, so as to achieve the technical effects of reducing power consumption and meeting the requirements of products to be manufactured by a process under a relatively low temperature (i.e., by a low-temperature process).

The technical solution of the present disclosure has important significance for development and mass production of GOA products to be manufactured by a low-temperature or flexible process; the technical solution disclosed by the present disclosure may be applied to relatively high-quality panels requiring TFTs with relatively high performances, such as 4K top emission type OLED (organic light emitting diode) panels (the OLED may be manufactured by adopting processes such as ink-jet printing and evaporation and the like), 8K top emission type OLED panels and the like.

Figure 3:
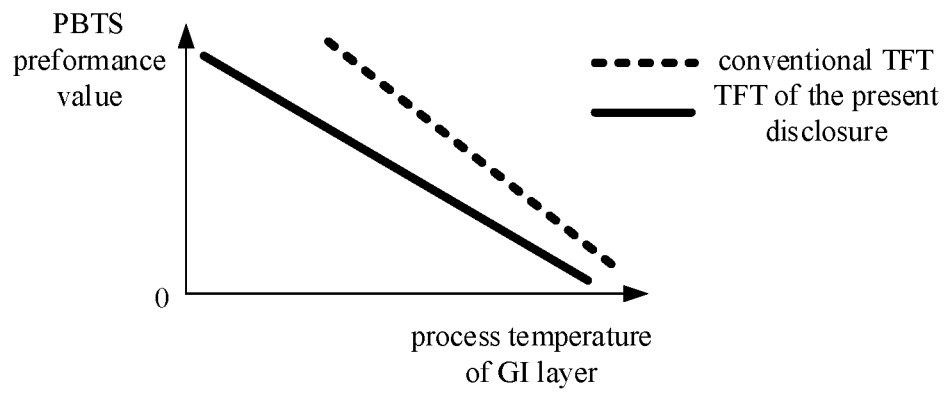
FIG. 3 is a schematic diagram showing comparision between PBTS performances of a thin film transistor provided by an embodiment of the present disclosure and a conventional thin film transistor.

FIG. 3 is a schematic diagram showing comparision between PBTS performances of a thin film transistor provided by the embodiment of the present disclosure and a conventional thin film transistor, FIG. 3 illustrates variations of PBTS stability values of the thin film transistor provided in the embodiment of the present disclosure and the conventional thin film transistor under different process temperatures for manufacturing the gate insulating layer; as can be seen from FIG. 3, under a same process temperature for munufacturing the gate insulating layer, the thin film transistor provided in the embodiment of the present disclosure has better PBTS performance (the smaller the PBTS stability value is, the better the PBTS performance is); and for a same PBTS stability value, the thin film transistor provided in the embodiment of the present disclosure requires a lower process temperature for manufacturing the gate insulation layer.

It should be noted that FIG. 1 only shows one active layer pattern 2 by way of example, which is only exemplary, and in practical applications, the at least one active layer pattern 2 may include two, three or even more active layer patterns.

In some implementations, the at least one active layer pattern 2 includes a plurality of active layer patterns 2, and the semiconductor pattern 203 of each of the active layer patterns 2 is provided with the conductive shielding pattern 5 corresponding thereto. In such case, the electrical performance of each semiconductor pattern 203 can be improved to a certain extent, and the overall performance of the thin film transistor can be greatly improved.

It should be noted that, when the at least one active layer pattern 2 includes the plurality of active layer patterns, first conductive patterns of the active layer patterns 2 are all electrically connected to the first electrode 3, and second conductive patterns of the active layer patterns 2 are all electrically connected to the second electrode 4, that is, the active layer patterns 2 are connected in parallel to form a parallel structure, a channel width-to-length ratio of the thin film transistor can be effectively increased, and signal output capability of the thin film transistor can be effectively improved.

In some implementations, the conductive shielding pattern 5 configured for the semiconductor pattern 203 of the active layer pattern 2 completely covers the semiconductor pattern 203 corresponding to the conductive shielding pattern 5, and in such case, the conductive shielding pattern 5 can effectively protect all regions of the semiconductor pattern 203 corresponding to the conductive shielding pattern 5, so as to avoid interference of an external electric field on any region of the semiconductor pattern 203, which is beneficial to further improving the PBTS performance of the thin film transistor; therefore, the case where the conductive shielding pattern 5 completely covers the semiconductor pattern 203 corresponding thereto is a relatively good implementation in the embodiment of the present disclosure, which does not limit the technical solution of the present disclosure.

It should be understood by those skilled in the art that, in the embodiment of the present disclosure, as long as the conductive shielding pattern 5 covers at least part of regions of the semiconductor pattern 203 corresponding to the conductive shielding pattern 5, the PBTS performance of the thin film transistor can be improved to a certain extent; accordingly, the requirement for the film-forming quality of the gate insulating layer 7 can be decreased to a certain extent, and the process temperature during the process for manufacturing the gate insulating layer 7 can also be decreased to a certain extent.

In some implementations, the conductive shielding pattern 5 includes a conductive and light-shielding material. That is, the conductive shielding pattern 5 can not only conduct electricity but also shield light. In some implementations, the material of the semiconductor pattern 203 is sensitive to light, and when the semiconductor pattern is exposed to light with different intensities, electrical characteristics of the semiconductor pattern are quite different; in order to avoid drift of the electrical characteristics of the semiconductor pattern 203 being used due to light, in the technical solution of the embodiment of the present disclosure, the conductive shielding pattern 5 is made of the conductive and light-shielding material, which can weaken or even completely shield the interference of the external electric field on the semiconductor pattern 203 on one hand, and weaken or even completely avoid the influence of external light on the electrical characteristics of the semiconductor pattern 203 on the other hand.

In some implementations, the conductive and light-shielding material includes a metal material, where the metal material includes at least one of aluminum or molybdenum.

With continued reference to FIG. 2, in some implementations, the first conductive pattern 201 connected with the semiconductor pattern 203, provided with the conductive shielding pattern 5 corresponding thereto, is connected with the conductive shielding pattern 5 through a via hole in the buffer layer 6. In such case, the conductive shielding pattern 5 is electrically connected to the first electrode 3 through the first conductive pattern 201.

In some implementations, when the second electrode 4 of the thin film transistor is in a floating state, noise is caused in the second conductive pattern 202 by the external electric field under an action of electric field coupling, in such case, noise may also exist in the second electrode 4 of the thin film transistor. To reduce the above-mentioned noise, in some implementations, the orthographic projection of the conductive shielding pattern 5 on the plane where the semiconductor pattern 203 corresponding to the conductive shielding pattern 5 is located also covers at least part of regions of the second conductive pattern 202 connected with the semiconductor pattern 203 corresponding to the conductive shielding pattern 5. In such case, the conductive shielding pattern 5 can also effectively reduce or even prevent noise occuring in the second conductive pattern 202 and/or the second electrode 4 due to the external electric field.

In some implementations, the at least one active layer pattern includes a plurality of the active layer patterns, and the active layer patterns are arranged along a first preset direction; the gate, the first electrode and the second electrode each extend along the first preset direction, the first electrode is electrically connected with the first conductive patterns of the active layer patterns, and the second electrode is electrically connected with the second conductive patterns of the active layer patterns. The following detailed description will be given with reference to a specific example.

Figure 4:
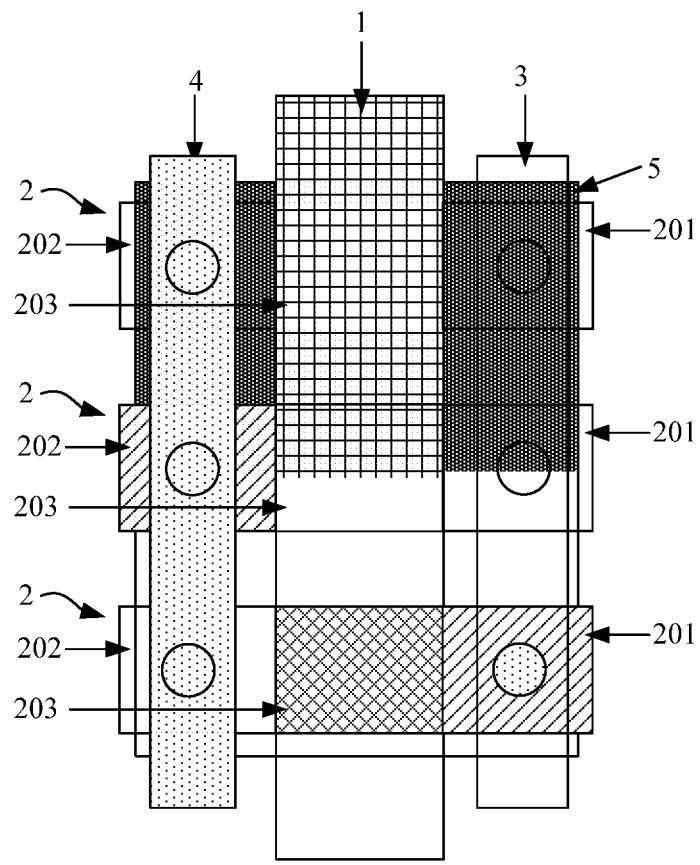
FIG. 4 is a top view of a thin film transistor provided in an embodiment of the present disclosure.

FIG. 4 is a top view of a thin film transistor provided in an embodiment of the disclosure, and as shown in FIG. 4, it is different from the thin film transistor shown in FIG. 1 in that, three active layer patterns 2 are provided in the thin film transistor shown in FIG. 4, and the three active layer patterns 2 are arranged along the first preset direction (corresponding to a column direction in the drawing). Each of the three active layer patterns is provided with the conductive shielding pattern corresponding thereto, and three conductive shielding patterns provided corresponding to the three active layer patterns are connected into one piece to form a relatively large-sized conductive shielding pattern 5. Specifically, semiconductor patterns 203 of the three active layer patterns 2 correspond to the relatively large-sized conductive shielding pattern 5, that is, different portions of the relatively large-sized conductive shielding pattern 5 correspond to the semiconductor patterns 203 of the three active layer patterns 2 respectively.

In addition, an orthographic projection of the relatively large-sized conductive shielding pattern 5 on an plane where the semiconductor patterns 203 are located further covers at least part of regions of each second conductive pattern 202.

Figure 5:
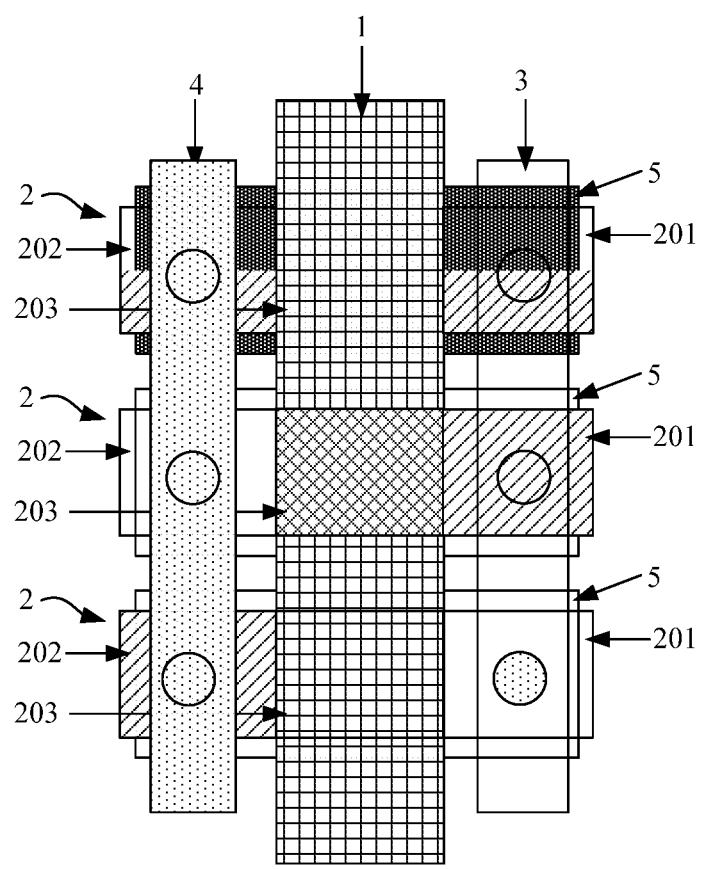
FIG. 5 is a top view of a thin film transistor provided in an embodiment of the present disclosure.

FIG. 5 is a top view of a thin film transistor provided in an embodiment of the disclosure, and as shown in FIG. 5, it is different from the thin film transistor shown in FIG. 4 in that, the semiconductor patterns 203 of the three active layer patterns 2 in the thin film transistor shown in FIG. 5 each correspond to a relatively small-sized conductive shielding pattern 5, and three relatively small-sized conductive shielding patterns 5 are disposed at intervals for corresponding to the semiconductor patterns 203 of the three active layer patterns 2, and are all electrically connected to the first electrode.

Figure 6:
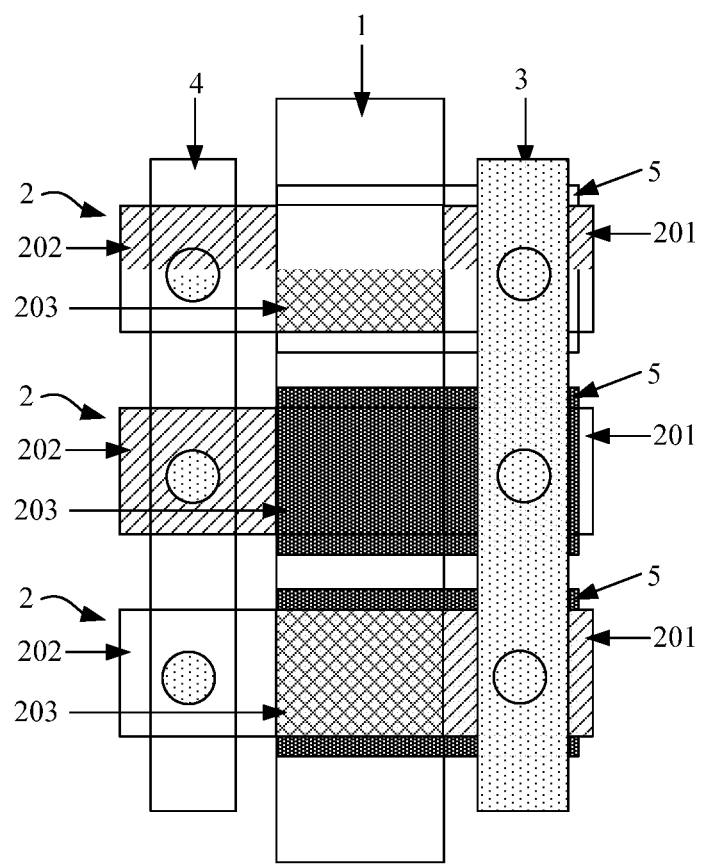
FIG. 6 is a top view of a thin film transistor provided in an embodiment of the present disclosure.

As shown in FIG. 6, it is different from the thin film transistor shown in FIG. 5 in that, the three conductive shielding patterns 5 in the thin film transistor shown in FIG. 6 each only cover the respective semiconductor pattern 203 corresponding thereto, but do not cover the second conductive pattern 202.

Figure 7A:
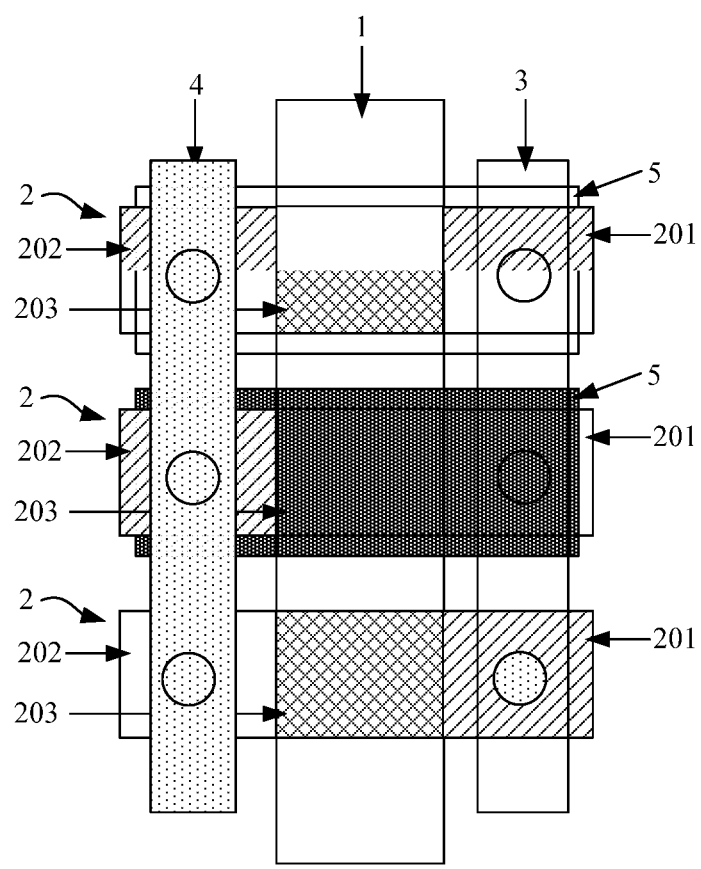
FIG. 7a is a top view of a thin film transistor provided in an embodiment of the present disclosure.

FIG. 7a is a top view of a thin film transistor provided in an embodiment of the present disclosure, and as shown in FIG. 7a, it is different from the thin film transistor shown in FIG. 5 in that, three active layer patterns 2 are provided in the thin film transistor shown in FIG. 7a, but only the semiconductor patterns 203 of two of the active layer patterns 2 are provided with the conductive shielding patterns 5 respectively corresponding thereto, and the two active layer patterns 2 provided with the conductive shielding patterns 5 corresponding thereto are adjacent to each other.

Figure 7B:
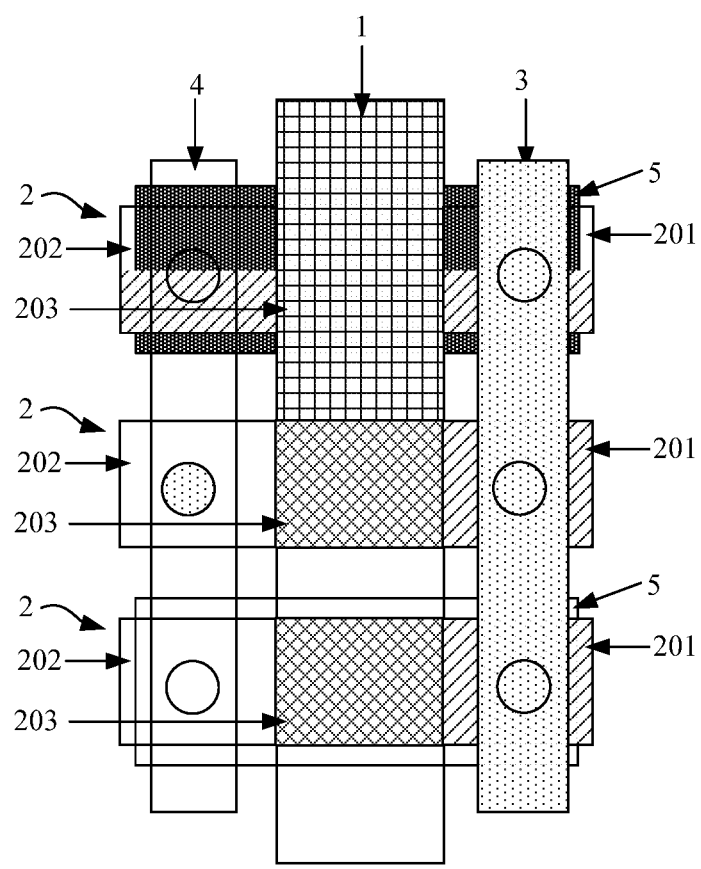
FIG. 7b is a top view of a thin film transistor provided in an embodiment of the present disclosure.

FIG. 7b is a top view of a thin film transistor provided in an embodiment of the disclosure, and as shown in FIG. 7b, it is different from the thin film transistor shown in FIG. 7a in that, the two active layer patterns 2 provided with the conductive shielding patterns 5 corresponding thereto in the thin film transistor shown in FIG. 7b are not adjacent to each other.

Figure 8A:
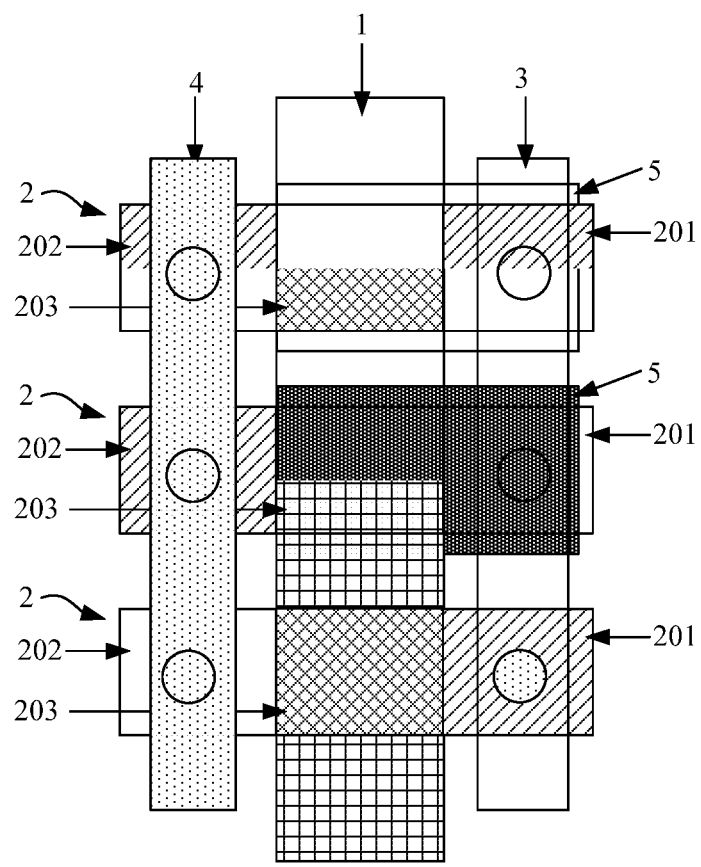
FIG. 8a is a top view of a thin film transistor provided in an embodiment of the present disclosure.
Figure 8B:
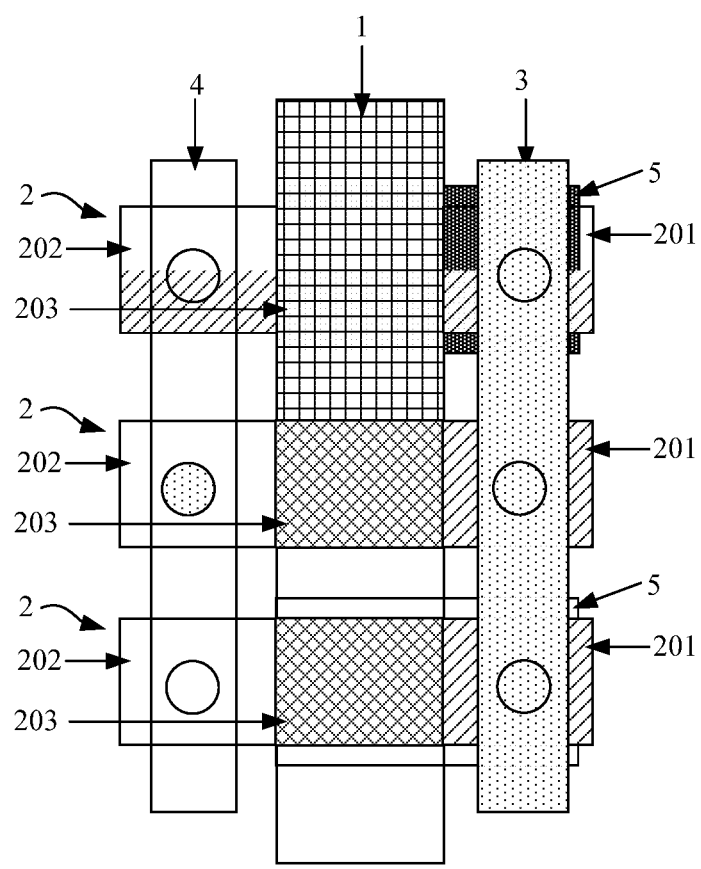
FIG. 8b is a top view of a thin film transistor provided in an embodiment of the present disclosure.

FIG. 8a is a top view of a thin film transistor provided in an embodiment of the present disclosure, and FIG. 8b is a top view of a thin film transistor provided in an embodiment of the present disclosure, and as shown in FIGS. 8a and 8b, it is different from the thin film transistors shown in FIGS. 7a and 7b in that, the two conductive shielding patterns 5 in the thin film transistors shown in FIGS. 8a and 8b each only cover the respective semiconductor pattern 203 corresponding thereto, but do not cover the second conductive pattern 202.

Certainly, when multiple active layer patterns 2 are provided in the thin film transistor, it also may be possible to provide the conductive shielding pattern 5 corresponding to only the semiconductor pattern 203 in one of the active layer patterns 2, which is not shown in the drawings.

It should be noted that, shapes and the number of the active layer patterns 2 are not limited in the present disclosure, and the number of the active layer patterns 2 provided with the conductive shielding pattern 5 corresponding thereto is also not limited in the present disclosure. Other cases will not be described here in detail.

In order to make the thin film transistor output a relatively large current, the channel width-to-length ratio of the thin film transistor is desired to be relatively large (for example, the channel width-to-length ratio may be greater than 60), and in such case, the solution (for example, as shown in FIGS. 4 to 8b) that the active layer patterns 2 are arranged along the first preset direction may cause a relatively large size of the thin film transistor in the first preset direction, which is not favorable for layout design.

Figure 9:
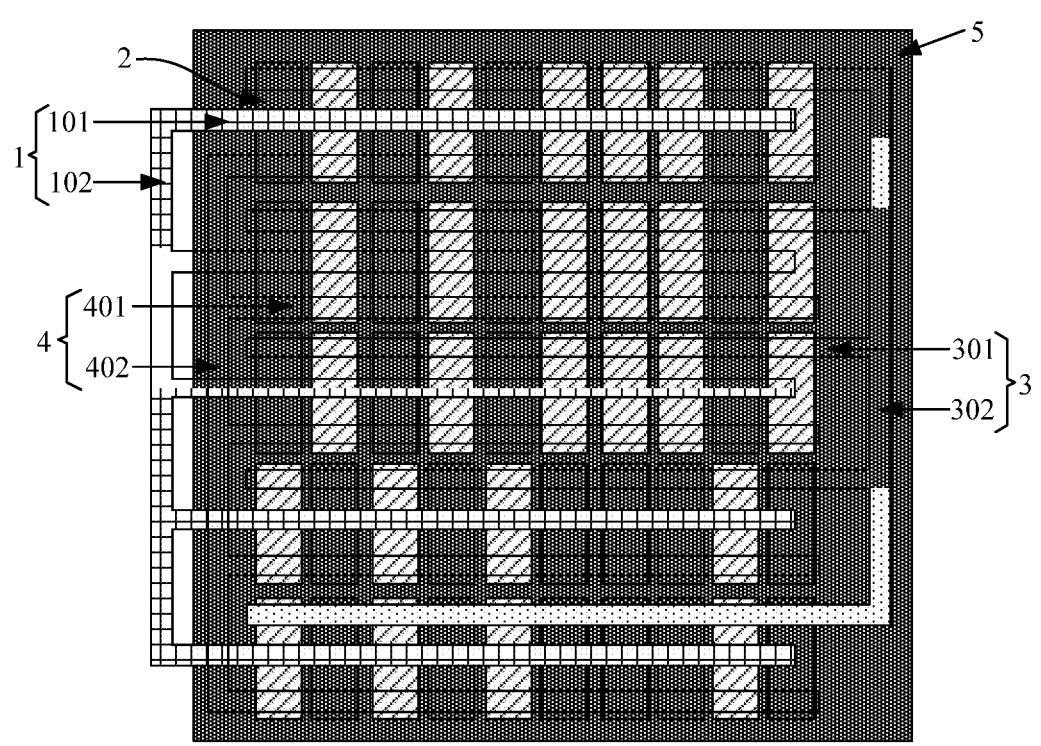
FIG. 9 is a top view of a thin film transistor provided in an embodiment of the present disclosure.

In order to solve the above technical problem, an embodiment of the present disclosure provides another technical solution. FIG. 9 is a top view of a thin film transistor provided in an embodiment of the present disclosure, as shown in FIG. 9, in some implementations, the first electrode 3, the second electrode 4, and the gate 1 of the thin film transistor each are a comb-shaped electrode.

The first electrode 3 includes a plurality of first comb-tooth portions 301 arranged in a second preset direction (corresponding to a column direction in the drawing) and a first connecting portion 302 connected with first ends of the first comb-tooth portions 301, the second electrode 4 includes a plurality of second comb-tooth portions 401 arranged along the second preset direction and a second connecting portion 402 connected with second ends of the second comb-tooth portions 401, the gate 1 includes a plurality of third comb-tooth portions 101 arranged in the second preset direction and a third connecting portion 102 connected with second ends of the third comb-tooth portions 101, the first comb-tooth portions 301, the second comb-tooth portions 401, and the third comb-tooth portions 101 each extend in a third preset direction (corresponding to a row direction in the drawing).

The first comb-tooth portions 301 and the second comb-tooth portions 401 are alternately arranged in the second preset direction, any pair of the first comb-tooth portion 301 and the second comb-tooth portion 401, which are adjacent to each other, defines a corresponding active layer pattern arrangement area for arranging the active layer pattern 2, one of the third comb-tooth portions 101 and multiple active layer patterns 2 arranged along the second preset direction are arranged in the active layer pattern arrangement area, the first conductive patterns of the active layer patterns 2 are connected with the first comb-tooth portion 301 corresponding thereto, and the second conductive patterns of the active layer patterns 2 are connected with the second comb-tooth portion 401 corresponding thereto. In such case, the active layer patterns 2 are arranged in an array and are connected in parallel to form a parallel structure, and a relatively ultra-large channel width-to-length ratio can be realized.

In the solution shown in FIG. 9, each of the active layer pattern is provided with the conductive shielding pattern 5 corresponding thereto, and conductive shielding patterns provided corresponding to all the active layer patterns are connected into one piece to form a relatively large-sized conductive shielding pattern 5.

In addition, the orthographic projection of the conductive shielding pattern 5 on the plane where the semiconductor patterns corresponding thereto are located not only completely covers the semiconductor patterns corresponding thereto, but also covers the second conductive patterns connected to the semiconductor patterns corresponding thereto.

An embodiment of the present disclosure further provides a shift register, which includes the thin film transistor provided in the embodiment of the present disclosure. For the detailed description of the thin film transistor, reference may be made to the corresponding contents in the foregoing embodiment, and details are not repeated here.

At least one constant voltage supply transistor is arranged in the shift register, and the constant voltage supply transistor specifically refers to a transistor having a control electrode electrically connected with a control signal terminal, a first electrode connected with a constant voltage signal input terminal, and a second electrode connected with a signal-to-be-supplied terminal. In the embodiment of the present disclosure, the constant voltage supply transistor in the shift register employs the thin film transistor provided in the embodiment of the present disclosure.

Figure 10:
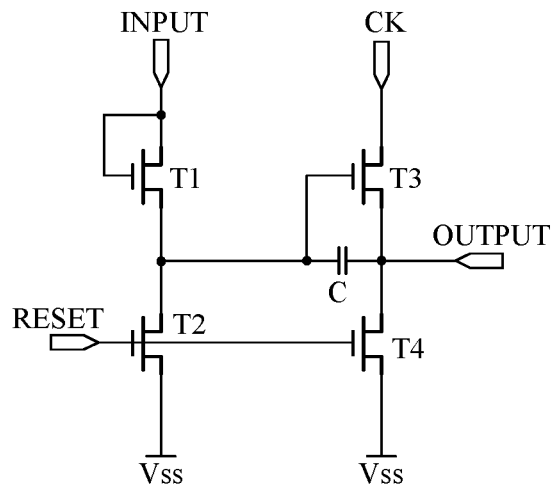
FIG. 10 is a schematic diagram of a circuit structure of a shift register provided in an embodiment of the present disclosure.

FIG. 10 is a schematic diagram of a circuit structure of a shift register provided in an embodiment of the present disclosure, and as shown in FIG. 10, the shift register adopts a 4T1C structure, that is, includes four switch transistors T1 to T4 and one capacitor C; specifically, a control electrode and a first electrode of a first switching transistor T1 are both connected to a signal input terminal INPUT of the shift register, and a second electrode of the first switching transistor T1 is connected to a control electrode of a third switching transistor T3; a control electrode of a second switching transistor T2 is connected to a reset signal terminal RESET, a first electrode of the second switching transistor T2 is connected to a first constant voltage signal input terminal (e.g., supplying a first constant voltage Vss), and a second electrode of the second switching transistor T2 is connected to the control electrode of the third switching transistor T3; a first electrode of the third switching transistor T3 is connected to a clock signal input terminal, and a second electrode of the third switching transistor T3 is connected to a signal output terminal OUTPUT of the shift register; a control electrode of a fourth switching transistor T4 is connected to the reset signal terminal RESET, a first electrode of the fourth switching transistor T4 is connected to a second constant voltage signal input terminal (e.g., supplying a second constant voltage Vss), and a second electrode of the fourth switching transistor T4 is connected to the signal output terminal OUTPUT of the shift register.

The second switching transistor T2 is also called a pull-down transistor, and generally has a channel with a width of about 450 nm and a length of about 6 nm; the fourth switching transistor T4 is also called an output transistor, and generally has a channel with a width of about 2000 nm and a length of about 6 nm.

The second switching transistor T2 and the fourth switching transistor T4 are both constant voltage supply transistors, and thus the second switching transistor T2 and the fourth switching transistor T4 each may adopt the thin film transistor provided in embodiment of the present disclosure.

It should be noted that, the case shown in FIG. 9 that the shift register adopts the 4T1C structure is only exemplary, and it does not limit the technical solution of the present disclosure, and the shift register in the embodiment of the present disclosure may also adopt other structures, which are not illustrated here.

An embodiment of the disclosure further provides a gate driving circuit, which includes the shift register provided in the foregoing embodiment.

Figure 11:
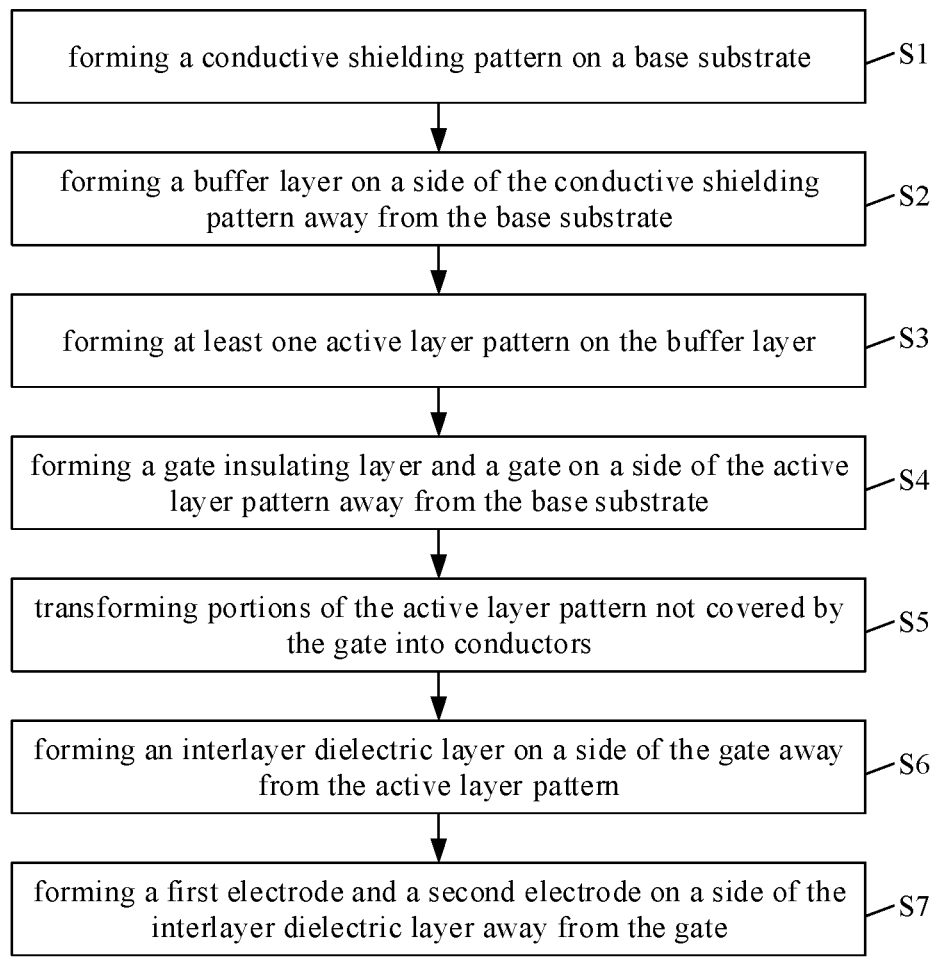
FIG. 11 is a flowchart of a method for manufacturing a thin film transistor provided in an embodiment of the present disclosure.
Figure 12A:
FIGS. 12a to 12f are schematic structural diagrams of intermediate products of the thin film transistor manufactured by the method shown in FIG. 11.
Figure 12B:
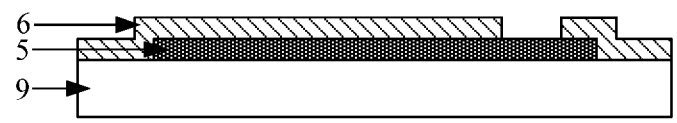
Figure 12C:
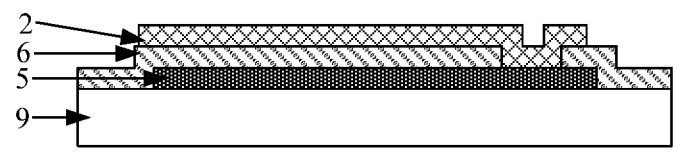
Figure 12D:
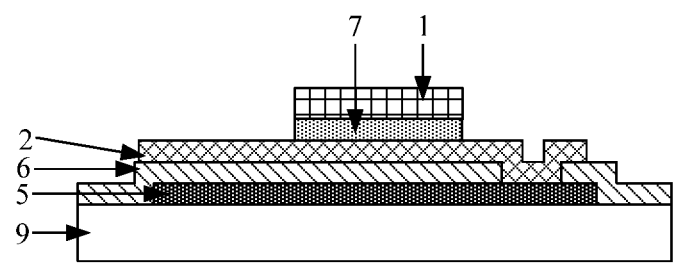
Figure 12E:
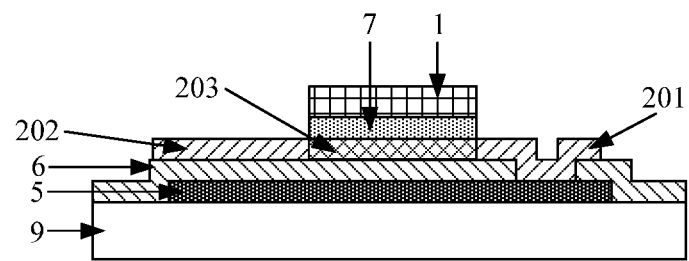
Figure 12F:
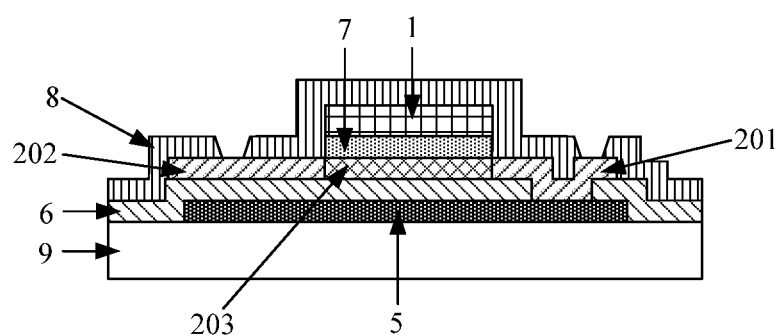

FIG. 11 is a flowchart of a method for manufacturing a thin film transistor provided in an embodiment of the present disclosure, and FIGS. 12a to 12f are schematic structural diagrams of intermediate products of the thin film transistor manufactured by the method shown in FIG. 11, as shown in FIGS. 11 to 12f, the method is used for manufacturing the thin film transistor according to the embodiment of the present disclosure, and the method includes steps S1 to S7.

At step S1, forming a conductive shielding pattern on a base substrate.

Referring to FIG. 12a, a conductive shielding material film is first deposited on the base substrate 9, and then a patterning (Photo) process is performed on the conductive shielding material film to obtain the conductive shielding pattern 5. The conductive shielding material film may include a conductive and light-shielding material such as a metal material (e.g., aluminum, molybdenum, etc.).

The patterning process in the embodiment of the present disclosure generally refers to processes including photoresist coating, exposure, development, thin film etching, photoresist stripping, and the like. When the material of the film to be patterned is a photoresist material, the patterning of the film made of the photoresist material can be realized only through exposure and development.

At step S2, forming a buffer layer on a side of the conductive shielding pattern away from the base substrate, where a via hole communicated to the conductive shielding pattern is formed in the buffer layer.

Referring to FIG. 12b, a buffer material film is first deposited on a surface of the substrate subjected to the step S1, and then a patterning process is performed on the buffer material film to form a via hole communicated to the conductive shielding patterns 5, so as to obtain a pattern of the buffer layer 6. A material of the buffer material film may include a silicon nitride ($SiN_x$) and/or a silicon oxide ($SiO_2$), and the process for depositing may be a Plasma Enhanced Chemical Vapor Deposition (PECVD) process.

At step S3, forming at least one active layer pattern on the buffer layer.

Referring to FIG. 12c, an active material film is first deposited on a surface of the substrate subjected to the step S2, and then a patterning process is performed on the active material film to obtain the active layer pattern 2. A material of the active material film may include a metal oxide (for example, indium gallium zinc oxide) semiconductor material.

At step S4, forming a gate insulating layer and a gate on a side of the active layer pattern away from the base substrate, where the gate insulating layer is located between the active layer pattern and the gate.

Referring to FIG. 12d, first, a gate insulating material film and a gate conductive material film are deposited on a surface of the substrate subjected to the step S3; then, a patterning process (generally adopting wet etching) is performed on the gate conductive material film to obtain a pattern of the gate 1; then, a patterning process is performed on the gate insulating material film (generally adoting dry etching) by using the pattern of the gate 1 as a mask, so as to obtain a pattern of the gate insulating layer 7.

The gate conductive material film may be made of a metal material, such as molybdenum, titanium, aluminum, and the like, and may have a single-layer film structure or a multilayer film laminated structure; the gate insulating material film may be a silicon oxide film, a silicon nitride film, or a laminated structure of the silicon oxide film and the silicon nitride film.

At step S5, transforming portions of the active layer pattern not covered by the gate into conductors.

In order to facilitate carriers in a channel region of the active layer pattern 2 to reach the first electrode 3 or the second electrode 4 more rapidly, regions of the active layer pattern 2 not covered by the gate insulating layer 7 may be transformed into conductors to increase a migration rate of the carriers.

Referring to FIG. 12e, hydrogen plasma is injected into a surface of the substrate subjected to the step S4, the metal oxide semiconductor material in the regions of the active layer pattern 2 not covered by the gate insulating layer 7 contacts and reacts with the hydrogen plasma (i.e., hydrogen ions are combined with oxygen ions in the metal oxide semiconductor), and the metal oxide semiconductor material in the corresponding regions is deoxidized and converted into a metal simple substance having conductivity, i.e., the metal oxide semiconductor material is transformed into a conductor. That is, the first conductive pattern 201 and the second conductive pattern 202 are obtained, the semiconductor pattern 203 (the portion of the active layer pattern 2 covered by the gate 1 and the gate insulating layer 7) is located between the first conductive pattern 201 and the second conductive pattern 202, at least a portion of the semiconductor pattern 203 is provided with the conductive shielding pattern 5 corresponding thereto, and an orthographic projection of the conductive shielding pattern 5 on a plane where the semiconductor pattern 203 corresponding to the conductive shielding pattern 5 is located at least partially covers the semiconductor pattern 203 corresponding to the conductive shielding pattern 5. In such case, the first conductive pattern 201 is directly connected to the conductive shielding pattern 5 corresponding thereto through the via hole in the buffer layer 6.

At step S6, forming an interlayer dielectric layer on a side of the gate away from the active layer pattern, and via holes communicated to the first conductive pattern and the second conductive pattern are formed in the interlayer dielectric layer.

Referring to FIG. 12f, first, an interlayer dielectric material film is deposited on a surface of the substrate subjected to the step S5, and then a patterning process is performed on the interlayer dielectric material film to form via holes communicated to the first conductive pattern 201 and the second conductive pattern 202, so as to obtain a pattern of the interlayer dielectric layer 8, the interlayer dielectric material film may be a silicon oxide film, a silicon nitride film or a laminated structure of the silicon oxide film and the silicon nitride film.

At step S7, forming a first electrode and a second electrode on a side of the interlayer dielectric layer away from the gate.

Referring to FIG. 2, a source-drain conductive material film is first deposited on a surface of the substrate subjected to the step S6, and then a patterning process is performed on the source-drain conductive material film to obtain patterns of the first electrode 3 and the second electrode 4, where the first electrode 3 and the second electrode 4 are connected to the first conductive pattern 201 and the second conductive pattern 202 through the via holes, respectively. In such case, the first electrode 3 is electrically connected to the conductive shielding pattern 5 through the first conductive pattern 201. The source-drain conductive material film may be made of metal materials, such as molybdenum, titanium, aluminum and the like; the source-drain material film may be a single-layer film structure or a laminated structure of multilayer film.

It will be understood that the above embodiments are merely exemplary embodiments adopted to illustrate the principles of the present disclosure, and the present disclosure is not limited thereto. It will be apparent to those skilled in the art that various modifications and improvements may be made without departing from the spirit and scope of the present disclosure, and such modifications and improvements are also considered to be within the scope of the present disclosure.

The invention claimed is:

1. A thin film transistor, comprising:
   at least one active layer pattern, the at least one active layer pattern comprises a first conductive pattern, a second conductive pattern, and a semiconductor pattern located between the first conductive pattern and the second conductive pattern;
   a gate located on a side of the at least one active layer pattern and insulated from the at least one active layer pattern;
   a first electrode and a second electrode, which are located on a side of the gate away from the at least one active layer pattern, and are respectively electrically connected with the first conductive pattern and the second conductive pattern;
   a conductive shielding pattern is provided corresponding to the semiconductor pattern in the at least one active layer pattern, the conductive shielding pattern is located on a side of the semiconductor pattern away from the gate and is electrically connected with the first electrode, and a buffer layer is arranged between the conductive shielding pattern and the semiconductor pattern;

an orthographic projection of the conductive shielding pattern on a plane where the semiconductor pattern corresponding to the conductive shielding pattern is located at least partially covers the semiconductor pattern corresponding to the conductive shielding pattern, wherein the at least one active layer pattern includes a plurality of active layer patterns, and the plurality of active layer patterns are arranged in a first preset direction;

the gate, the first electrode, and the second electrode each extend along the first preset direction, the first electrode is electrically connected to first conductive patterns of the plurality of active layer patterns, and the second electrode is electrically connected to second conductive patterns of the plurality of active layer patterns.

2. The thin film transistor of claim 1, wherein the orthographic projection of the conductive shielding pattern on the plane where the semiconductor pattern corresponding to the conductive shielding pattern is located completely covers the semiconductor pattern corresponding to the conductive shielding pattern.

3. The thin film transistor of claim 1, wherein the orthographic projection of the conductive shielding pattern on the plane where the semiconductor pattern corresponding to the conductive shielding pattern is located further covers at least part of regions of the second conductive pattern to which the semiconductor pattern corresponding to the conductive shielding pattern is connected.

4. The thin film transistor of claim 1, wherein the conductive shielding pattern includes a conductive and light-shielding material.

5. The thin film transistor of claim 4, wherein the conductive and light-shielding material comprises a metal material.

6. The thin film transistor of claim 1, wherein the first conductive pattern connected with the semiconductor pattern which is provided with the conductive shielding pattern corresponding thereto is connected to the conductive shielding pattern through a via hole in the buffer layer.

7. The thin film transistor of claim 1, wherein the first electrode, the second electrode, and the gate each are a comb-shaped electrode;

the first electrode comprises a plurality of first comb-tooth portions arranged along a second preset direction and a first connecting portion connected with first ends of the first comb-tooth portions, the second electrode comprises a plurality of second comb-tooth portions arranged along the second preset direction and a second connecting portion connected with second ends of the second comb-tooth portions, the gate comprises a plurality of third comb-tooth portions arranged along the second preset direction and a third connecting portion connected with second ends of the third comb-tooth portions, the first comb-tooth portions, the second comb-tooth portions and the third comb-tooth portions each extend along a third preset direction;

the first comb-tooth portions and the second comb-tooth portions are alternately arranged in the second preset direction, any pair of the first comb-tooth portion and the second comb-tooth portion, which are adjacent to each other, defines a corresponding active layer pattern arrangement area, one of the third comb-tooth portions and multiple active layer patterns arranged along the second preset direction are provided in each active layer pattern arrangement area, the first conductive patterns in the plurality of active layer patterns are connected with the first comb-tooth portion corresponding thereto, and the second conductive patterns in the plurality of active layer patterns are connected with the second comb-tooth portion corresponding thereto.

8. The thin film transistor of claim 1, wherein the semiconductor pattern in each of the plurality of active layer patterns is provided with the conductive shielding pattern corresponding thereto.

9. The thin film transistor of claim 8, wherein conductive shielding patterns provided corresponding to semiconductor patterns of the plurality of active layer patterns are connected into one piece.

10. A shift register, comprising: the thin film transistor of claim 1.

11. The shift register of claim 10, comprising: a constant voltage supply transistor, a control electrode of the constant voltage supply transistor is electrically connected with a control signal terminal, a first electrode of the constant voltage supply transistor is connected with a constant voltage signal input terminal, and a second electrode of the constant voltage supply transistor is connected with a signal-to-be-supplied terminal;

where the constant voltage supply transistor employs the thin film transistor.

12. A gate driving circuit, comprising: the shift register of claim 10.

13. The thin film transistor of claim 2, wherein the semiconductor pattern in each of the plurality of active layer patterns is provided with the conductive shielding pattern corresponding thereto.

14. The thin film transistor of claim 3, wherein the semiconductor pattern in each of the plurality of active layer patterns is provided with the conductive shielding pattern corresponding thereto.

15. The thin film transistor of claim 4, wherein the semiconductor pattern in each of the plurality of active layer patterns is provided with the conductive shielding pattern corresponding thereto.

16. The thin film transistor of claim 6, wherein the semiconductor pattern in each of the plurality of active layer patterns is provided with the conductive shielding pattern corresponding thereto.

17. The thin film transistor of claim 1, wherein conductive shielding patterns provided corresponding to semiconductor patterns of the plurality of active layer patterns are connected into one piece.

18. A method of manufacturing a thin film transistor, the thin film transistor comprises: at least one active layer pattern, the at least one active layer pattern comprises a first conductive pattern, a second conductive pattern, and a semiconductor pattern located between the first conductive pattern and the second conductive pattern; a gate located on a side of the at least one active layer pattern and insulated from the at least one active layer pattern; a first electrode and a second electrode, which are located on a side of the gate away from the at least one active layer pattern, and are respectively electrically connected with the first conductive pattern and the second conductive pattern; a conductive shielding pattern is provided corresponding to the semiconductor pattern in the at least one active layer pattern, the conductive shielding pattern is located on a side of the semiconductor pattern away from the gate and is electrically connected with the first electrode, and a buffer layer is arranged between the conductive shielding pattern and the semiconductor pattern; an orthographic projection of the conductive shielding pattern on a plane where the semiconductor pattern corresponding to the conductive shielding pattern is located at least partially covers the semiconductor pattern corresponding to the conductive shielding pattern, the method comprises:

forming a conductive shielding pattern on a base substrate;

forming a buffer layer on a side of the conductive shielding pattern away from the base substrate, wherein a via hole communicated to the conductive shielding pattern is formed in the buffer layer;

forming at least one active layer pattern on the buffer layer;

forming a gate insulating layer and a gate on a side of the at least one active layer pattern away from the base substrate, wherein the gate insulating layer is located between the at least one active layer pattern and the gate;

transforming portions of the at least one active layer pattern not covered by the gate into conductors to obtain a first conductive pattern and a second conductive pattern, wherein a portion of the at least one active layer pattern between the first conductive pattern and the second conductive pattern is formed into a semiconductor pattern, at least part of the semiconductor pattern is provided with the conductive shielding pattern corresponding thereto, and an orthographic projection of the conductive shielding pattern on a plane where the semiconductor pattern corresponding to the conductive shielding pattern is located at least partially covers the semiconductor pattern corresponding to the conductive shielding pattern;

forming an interlayer dielectric layer on a side of the gate away from the at least one active layer pattern, wherein via holes communicated with the first conductive pattern and the second conductive pattern are formed in the interlayer dielectric layer; and forming a first electrode and a second electrode on a side of the interlayer dielectric layer away from the gate, wherein the first electrode and the second electrode are respectively connected with the first conductive pattern and the second conductive pattern through the via holes in the interlayer dielectric layer, and the first electrode is electrically connected with the conductive shielding pattern.

* * * * *